United States Patent
Marchand et al.

(10) Patent No.: US 9,506,976 B2
(45) Date of Patent: Nov. 29, 2016

(54) USB PERIPHERAL DEVICE DETECTION ON AN UNPOWERED BUS

(71) Applicant: THOMSON LICENSING, Issy de Moulineaux (FR)

(72) Inventors: Phillippe Marchand, Vitre (FR); Philippe Guillot, Bruz (FR); Xavier Guitton, La Chapelle des Fougeretz (FR)

(73) Assignee: Thomson Licensing, Issy les Moulineaux (FR)

( * ) Notice: Subject to any disclaimer, the term of this patent is extended or adjusted under 35 U.S.C. 154(b) by 386 days.

(21) Appl. No.: 14/076,446

(22) Filed: Nov. 11, 2013

(65) Prior Publication Data

US 2014/0132083 A1 May 15, 2014

(30) Foreign Application Priority Data

Nov. 14, 2012 (FR) ...................................... 12 60842

(51) Int. Cl.
*G06F 13/40* (2006.01)
*G01R 31/28* (2006.01)

(52) U.S. Cl.
CPC ....... *G01R 31/2832* (2013.01); *G06F 13/4072* (2013.01); *G06F 13/4081* (2013.01); *G06F 2213/0042* (2013.01); *Y10T 307/858* (2015.04)

(58) Field of Classification Search
CPC ........... G01R 31/2832; G06F 13/4072; G06F 13/4081; G06F 2213/0042; Y10T 307/858
USPC ...................................................... 307/130
See application file for complete search history.

(56) References Cited

U.S. PATENT DOCUMENTS

| 7,679,317 B2 | 3/2010 | Veselic |
| 7,908,414 B2 | 3/2011 | Combs et al. |
| 8,013,616 B2 | 9/2011 | Crumlin et al. |
| 8,024,491 B1 | 9/2011 | Wright et al. |
| 8,084,987 B2 | 12/2011 | Hurtz |
| 2002/0138776 A1 | 9/2002 | Cohen et al. |

(Continued)

FOREIGN PATENT DOCUMENTS

| CN | 201570873 | 9/2010 |
| EP | 1302859 | 4/2003 |

(Continued)

OTHER PUBLICATIONS

SearchRept:Aug. 12, 2013.

*Primary Examiner* — Hal Kaplan
(74) *Attorney, Agent, or Firm* — Brian J. Dorini; Reitseng Lin

(57) ABSTRACT

Method for detecting a connection of a peripheral device to a communication interface of an electronic device and associated detection circuit; the communication interface comprising a voltage power line for the power supply of a peripheral device, a range of nominal operating voltage values being associated with the power line, the method being characterized in that it comprises steps of application of a nominal voltage comprised in the range of nominal operating voltage values to the power line, of withdrawal of the nominal operating voltage applied to the power line, of detection, on the power line, in the presence of a residual voltage less than a threshold value of the nominal voltage value, of a transient signal resulting from the connection of the peripheral device to the interface, and of application of the nominal voltage to the voltage power line, according to the transient signal detected.

26 Claims, 4 Drawing Sheets

(56) References Cited

U.S. PATENT DOCUMENTS

| | | |
|---|---|---|
| 2002/0156949 A1 | 10/2002 | Kubo et al. |
| 2003/0059746 A1 | 3/2003 | Georges |
| 2005/0138239 A1 | 6/2005 | Kasahara |
| 2006/0271802 A1 | 11/2006 | Yanagawa |
| 2009/0200982 A1 | 8/2009 | Hurtz |
| 2009/0210734 A1 | 8/2009 | Schramm et al. |

FOREIGN PATENT DOCUMENTS

| | | |
|---|---|---|
| EP | 2383861 | 11/2011 |
| TW | 201128380 | 8/2011 |

USB PERIPHERAL DEVICE DETECTION ON AN UNPOWERED BUS

This application claims the benefit, under 35 U.S.C. §119 of French Patent Application 1260842, filed Nov. 14, 2012.

DOMAIN OF THE INVENTION

The invention relates to the domain of electronic domestic equipment comprising a communication interface equipped with a power line. In particular, the invention relates to a method for detecting the connection of an item of peripheral equipment to the interface when the power line is not activated.

PRIOR ART

Methods exist enabling the connection of a USB peripheral device to an item of equipment featuring a USB interface to be detected. A first method consists in detecting the variations of electrical potentials of the data lines of the USB BUS, these lines being equipped with pull-up or pull-down resistors. Another method consists in detecting the appearance, on a USB interface of a product, of a potential corresponding to the nominal voltage V_BUS of the USB bus.

Certain methods require powered circuits so that different electric potentials (or states) of the feeder lines or data lines that are scanned can be distinguished. Other methods require powering the USB bus in a nominal manner so that data exchanges are possible, according to a protocol, between the USB interface and a peripheral device connected to the interface.

However, the constraints of reducing the electrical consumption of domestic equipments are increasingly greater and the official directives that must be applied in the years to come for the purpose of reducing their electrical consumption require consumption to be reduced wherever possible.

SUMMARY OF THE INVENTION

The invention enables the situation to be improved by proposing a method for detecting the connection of a USB peripheral device to a USB interface of an item of equipment when the latter is not powered by its nominal voltage, particularly because the item of equipment is configured in low-consumption mode or in standby mode or when the nominal voltage of the interface is not applied and when a residual voltage subsists on the power line of the interface.

More particularly, the invention relates to a method for detecting a connection of a peripheral device to a communication interface of an electronic device, the communication interface comprising a voltage power line for supplying power to the peripheral device, a nominal value in a range of operating voltage values being associated to the power line, the method comprising the steps:

application, by the electronic device, of a nominal voltage comprised between the range of operating voltage values of the power line, withdrawal, by the electronic device, of the nominal operating voltage applied to the power line, detection, on the power line, in the presence of a residual voltage lower than a threshold value of the nominal voltage value, of a transient signal resulting from the connection of the peripheral device to the interface, generation of a control signal according to the transient signal detected, application of the nominal voltage to the voltage power line, according to the control signal generated.

For a USB communication interface, for example, the power line is commonly called V_BUS.

According to an embodiment of the invention, the communication interface is compatible with a Universal Serial Bus standard.

According to an embodiment of the invention, the residual voltage is generated by a dedicated power-supply circuit.

According to an embodiment of the invention, the threshold value is less than or equal to 10% of the nominal voltage.

According to an embodiment of the invention, the transient signal is a voltage drop of the residual voltage.

The invention relates to a circuit for supplying power and detecting, in an electronic device, a connection of a peripheral device to a communication interface of the electronic device, the communication interface comprising voltage power line for supplying power to the peripheral device, a nominal range of operating voltage values being associated to the power line, the detection circuit comprising:

a voltage generator circuit for the application, by said electronic device, of a nominal voltage comprised between said range of nominal operating voltage values of said power line, a detection circuit, in the presence of a residual voltage lower than a threshold value of said nominal voltage value, of a transient signal resulting from said connection of said peripheral device to said interface, a generation circuit of a control signal according to the transient signal detected, According to an embodiment of the invention, the voltage power line V_BUS is applied to a connector compatible with a Universal Serial Bus standard.

The invention further relates to any electronic device comprising a circuit for supplying power and detecting as described above.

LIST OF FIGURES

The invention will be better understood, and other specific features and advantages will emerge upon reading the following description, the description making reference to the annexed drawings wherein:

FIG. 3 shows a sequence corresponding to the connection of a

Figure 1:
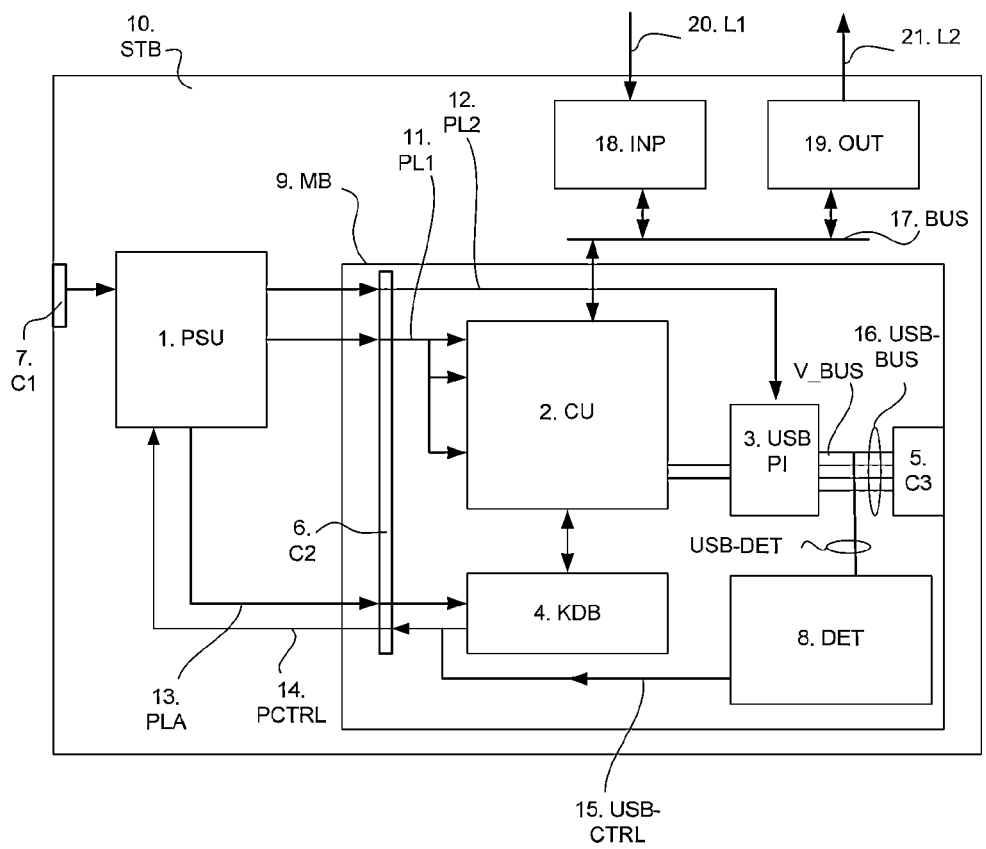
FIG. 1 illustrates an item of electronic equipment of the type receiver-decoder of digital television comprising a communication interface compatible with the USB standard, equipped with a connection detection circuit according to an embodiment of the invention.
Figure 2:
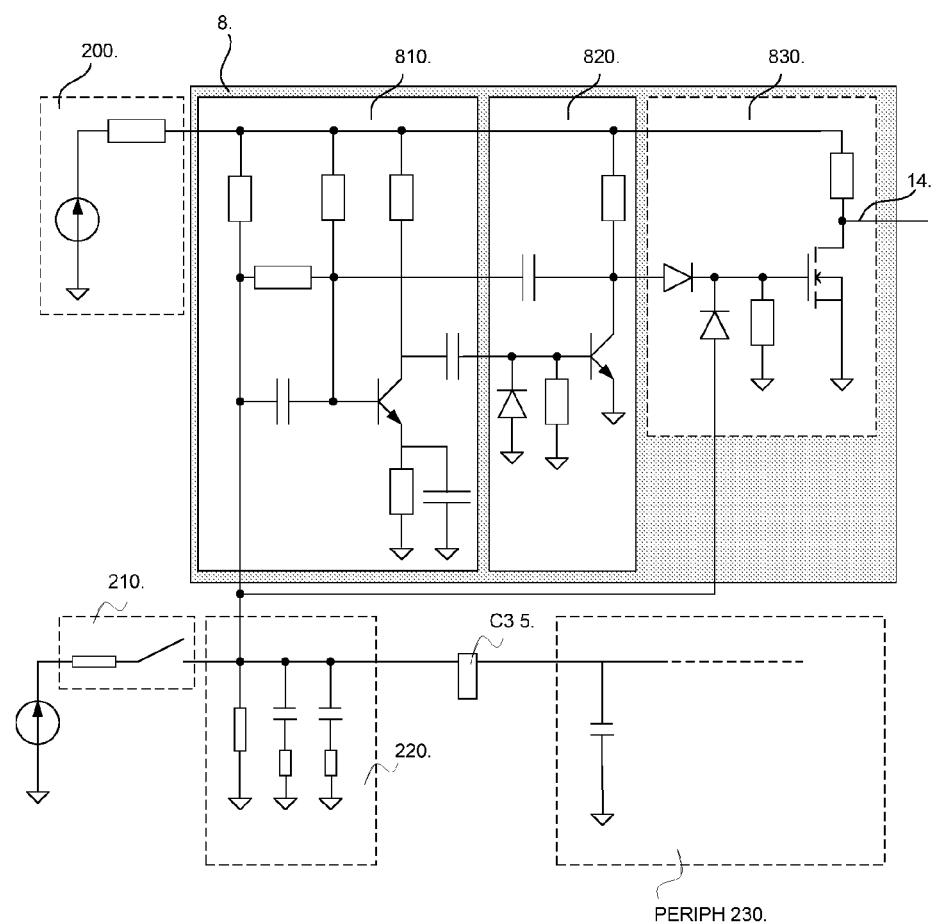
FIG. 2 shows the connection detection circuit of the USB interface in FIG. 1.

USB peripheral device to the interface of the equipment shown in FIG. 1, followed by the detection of the peripheral device by the detection circuit shown in FIG. 2 and the activation of the interface.

Figure 4:
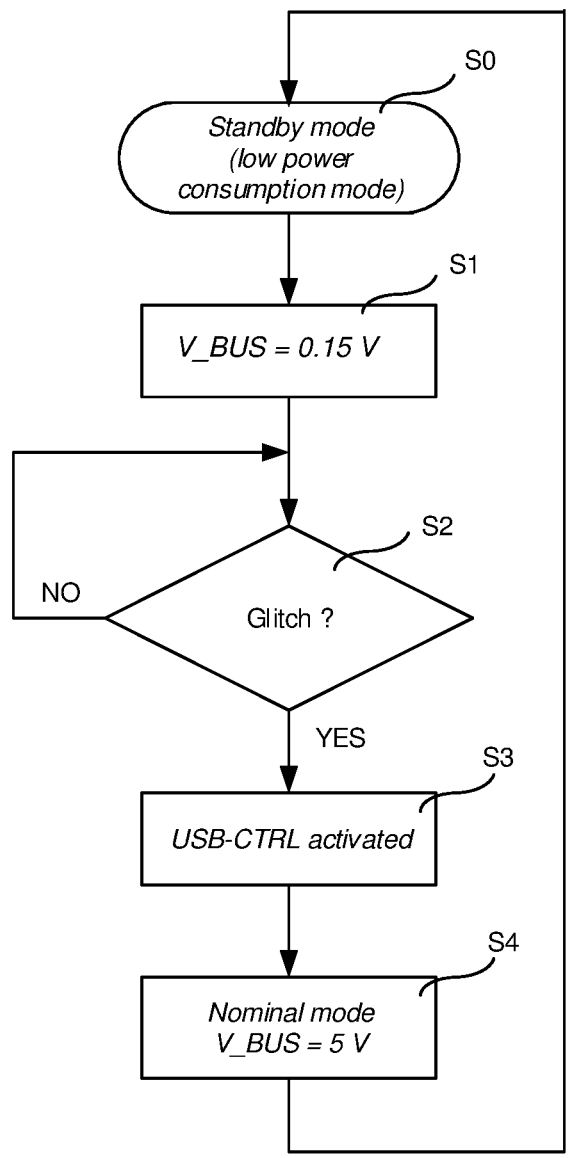

FIG. 4 is a diagram showing the steps of the detection and activation method.

DETAILED DESCRIPTION OF THE EMBODIMENTS OF THE INVENTION

Figure 3:
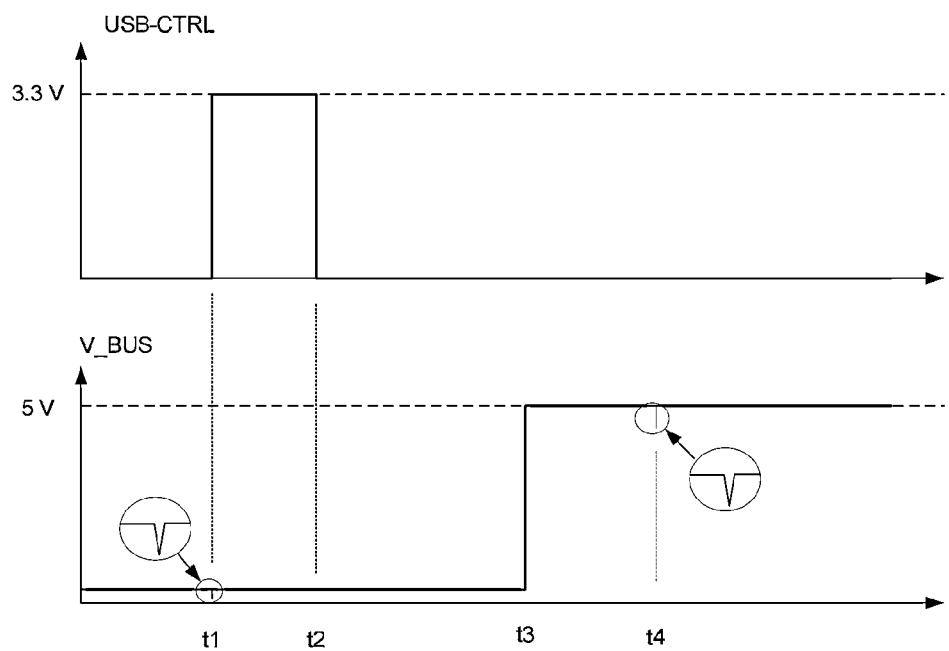

In FIGS. 1 to 3, the modules shown are functional units that may or may not correspond to physically distinguishable units. For example, these modules or some of them are grouped together in a single component, or constitute functions of the same software. On the contrary, according to other embodiments, some modules are composed of separate physical entities.

In a general but non-restrictive way, the invention relates to a method and a circuit for detecting the connection of a peripheral device to a communication interface when the latter is not supplied with nominal power. The detection thus enabling the activation of the power supply of the interface in nominal mode. This advantageously avoids having to supply power to the communication interface in nominal mode to allow its use on detection of the connection of a peripheral device. An important advantage is that this consequently helps to limit the energy consumption "Nominal mode" is understood to mean a power supply mode for which a voltage is comprised between a range of values around its nominal value. One example is, for a nominal voltage of 5 volts, the application of a voltage comprised between a range of voltages going from 4.5 volts to 5.5 volts. It is to be noted that a nominal value voltage is defined in the description of the present invention as a voltage enabling a normal operation of the device or devices or modules that it powers. For example, for a USB communication interface, the nominal voltage is the voltage adapted to the nominal (or normal) operation of the interface and notably to the exchanges of data between the host equipment and a connected peripheral device.

FIG. 1 illustrates an item of electronic equipment STB 10 of the type receiver-decoder of digital television, for example, according to the preferred embodiment of the invention. The item of electronic equipment comprises a main board MB 9, still called motherboard as well as a power supply module PSU 1, an input module INP 18 and an output module OUT 19. The motherboard MB9 comprises, among other elements, a USB communication interface composed of a power interface USBPI 3, a bus USB-BUS 16, a detection circuit DET 8 and a connector USB C3 5. The detection circuit DET 8 is connected to the bus USB-BUS 16 by a detection bus USB-DET.

The motherboard comprises a core circuit CU 2 that acts as a control and processing unit for the item of equipment STB 10. The motherboard MB 9 also comprises a stand-by (or low consumption) mode management circuit KDB 4. The circuit KDB 4 controls a signal PCTRL 14 enabling the controlled activation of certain power lines at the output of the power supply module PSU 1, such as the power line PL2 12 of the power interface USB PI 3 of the interface USB of the motherboard MB 9 or even the power line PL1 11 of the control unit CU 2 of the motherboard MB 9. A signal PLA 13 informs the management circuit KDB 4 of the status of the power supply module PSU 1, that is a configuration in stand-by (or low consumption) mode or not. All the lines PL1 11, PL2 12, PLA 13 and PCTRL 14 are connected to the motherboard MB 9 by means of a connector C2 6. The detection circuit of a peripheral device USB DET 8 supplies a signal USB-CTRL 15, connected to the signal PCTRL 14, and which enables the controlled activation of the power lines PL1 11 and PL2 12.

The input module INP 18 comprises all the circuits useful for the reception and demodulation of the digital television signals received by means of an input link L1 20. The output module OUT 19 supplies audio and video signals to an exterior recovery device (not shown here), such as, for example, a television set. The signals are carried by a link L2 21, that can be, for example, a SCART connector or an HDMI cable. All the signals exchanged between the control unit CU 2 and respectively the input INP 18 and output OUT 19 modules are carried by an interconnection bus BUS 17. The control unit CU 2 comprises all the circuits necessary for the reception and decoding functions of audiovisual contents coded using methods specific to the transmission of audiovisual programmes for digital television. These circuits which globally perform filtering, demultiplexing, memorisation, decoding and signal routing operations, are not shown here, being well known to those skilled in the art and not being necessary to the understanding of the present invention.

The power supply module PSU 1 is powered by a mains current by means of the connector C1 7.

According to the preferred embodiment of the invention, the power lines PL1 11 and PL2 12 are disabled when the receiver-decoder equipment STB10 is configured in stand-by mode. The power line PL2 12 which powers the power interface USBPI 3 of the USB communication interface is not supplied in a nominal manner, but carries a residual voltage whose presence is made possible by one or more electrical characteristics of the circuits, for example. It can be the presence of reservoir capacitor advantageously designed and calibrated for this purpose or even the clever use of a parasitic capacitor.

According to a variant embodiment of the invention, the residual voltage does not come from electrical characteristics specific to the circuits but from a specific power line 200, designed for this use.

The presence of the residual voltage contributes to the appearance of a transient signal on the bus USB-BUS 16 when a peripheral device is connected to the communication interface, on the connector C3 5.

The transient signal, still called "glitch", is amplified by the detection circuit DET 8 and formatted such that the calibrated signal USB-CTRL 15 is available at the output of the detection module DET 8 to be used as control signal PCTRL 14 at the input of the module PSU 1. The activation of the signal PCTRL 14 at the input of the module PSU 1 leads to the activation of the power line PL2 12 which thus carries a satisfactory nominal voltage of the use of the USB communication interface and notably of the exchange of data between the control unit CU2 of the receiver-decoder STB 10 and a USB peripheral device connected to the connector C3 5 of the interface USB. The peripheral device USB can be a USB key, an external hard disk or a storage medium compatible with the communication interface, for example.

FIG. 2 shows the details of the detection circuit DET 8 which appears in FIG. 1 as well as a power_circuit 200 enabling it to be supplied, including when the receiver-decoder STB 10 is configured in stand-by or low consumption mode. The power supply 210 is comprised in the module PSU 1 shown in FIG. 1 and supplies a nominal voltage on the line PL2 12 when it is controlled for this purpose. This nominal voltage is then applied to the power interface USBPI 3 of the USB communication interface of the receiver-decoder STB 10. The module 230 shows a USB peripheral device connected to the power line of the USB interface. The module 220 shows the electrical characteristics (resistive and capacitive) of the power line of the USB interface.

According to a particular and non-restrictive embodiment of the invention, the power circuit 200 is a subassembly of the power circuit 210.

The detection module DET 8, adapted to detect the connection of a USB peripheral device connected on the USB socket C3 5 of the receiver-decoder STB 10 is composed of three main modules 810, 820 and 830.

Module 810 is an amplifier adapted to the amplification of a transient signal (or glitch) that appears owing to the fact of the connection of a peripheral device to the USB socket.

Module 820 is a monostable that forms a peak calibrated signal from the amplified transient signal amplified by the amplifier 810.

Module 830 constitutes a NOR gate circuit inhibiting the detection of a transient at the output when the power line of the USB bus is supplied with a nominal voltage. It is to be noted that when the receiver-decoder equipment STB 10 is not configured in stand-by mode and that the power line of the USB interface (or bus) is supplied by a nominal value voltage, the detection of a peripheral device that has just been connected is achieved by data exchanges according to a predefined protocol, such as, for example, an enumeration phase or declaration phase, at the initiative of the host, namely at the initiative of the control unit CU 2 of the receiver-decoder STB. In this case, the protocol exchanges are most frequently carried out under software control.

The method for detecting the connection of a peripheral device according to the preferred embodiment of the invention thus relies on the detection of a transient signal that inevitably occurs when a discharged capacitor is suddenly connected to another capacitor at least partially charged. The voltage that appears at the moment of the connection depends on the ratio of the ESR values (Equivalent Series Resistance) of the capacitors involved. Within the context of a communication interface compatible with the USB standard, the capacitors to consider are generally electrolytic capacitors with value around 120 uF. For this type of capacitor, the usual ESR values are in the order of 250 to 500 milliohms (mohms). Most often, a small ceramic capacitor is connected in parallel with a 10 uF capacitor with an ESR value of 6 mohms. The USB peripheral device also has its equivalent capacitor at the input, in the order of 1 uF for a common ESR value of 30 mohms. The USB standard specifies using a chemical capacitor of 10 uF for a hot connection (when the interface is supplied by a nominal value voltage) in the order of 10 uF; which corresponds to an ESR generally much greater than 30 milliohms. To establish the ESR value of a capacitor of a USB peripheral device more precisely, the resistance value of the wires and the associated contact resistor must be added, that is generally more than 30 milliohms.

Considering this, the value of the voltage drop inherent to the connection of a peripheral device to the power line of the USB interface can be calculated, by first approximation, from the following formula:

$$V0 \times (1-(Rcu+Rc1)/(Rcu+Rc1+Rc2))$$

Where V0 is a residual voltage applied to the power line of the USB interface.

V0 is less than a threshold value of the nominal voltage value of the power line of the USB interface.

An example of threshold value for a USB interface is for example 10% of the nominal value, that is 0.5 volt.

Rc1 and Rc2 are respectively the ESR values of the capacitor connected to the USB peripheral device and the small ceramic capacitor of the power line of the USB interface.

Rcu is the equivalent resistance of the wire of the power line and the contact resistance.

This generally means considering that the voltage drop during the connection is in the order of 0.91×V0.

According to the prior art, there is no residual voltage present on the power line of a communication interface compatible with the USB standard. However, and in order to detect a transient signal of the type of a voltage drop, resulting from the connection of a peripheral device, a low potential is required. This is why, according to the preferred embodiment of the invention, a residual voltage in the order of 150 mV is applied to the power line of the USB interface when it is not powered in a nominal manner, as for example when the receiver-decoder STB 10 is in stand-by mode. This residual voltage of about 150 mV thus enables the appearance of a transient voltage drop in the order of 14 mV (0.09×150 mV). This transient voltage drop is amplified by the amplifier module 810 of the detection circuit DET 8, then formatted by the monostable module 820 to generate the signal USB-CTRL 15 at the output of the detection module DET 8. This signal is then conjugated or directly cabled with the signal PCTRL 14 which controls the activation of power lines at the output of the power supply module PSU 1, and notably the power line PL2 12 used to supply power to the power line of the USB interface.

The power supply 200 and detection DET 8 circuits can thus detect a connection of a peripheral device to the USB communication interface of the electronic device of type receiver-decoder STB 10, the USB communication interface comprising a voltage power line V_USB for supplying power to the peripheral device, a nominal operating voltage value being associated with the power line, the method comprising the steps:

application, by the electronic device STB 10, of a nominal voltage comprised between the range of nominal operating voltage values of the power line, V_BUS, such as, for example 5 volts, withdrawal, by the electronic device STB 10, via the power supply module PSU 1, of the nominal operating voltage applied to the power line V_BUS, detection, on the power line V_BUS, in the presence of a residual voltage lower than a threshold value of said nominal voltage value, such as for example 150 mV, of a transient voltage drop resulting from the connection of a peripheral device to the USB interface, the voltage drop being typically, in this case, in the order of 14 mV, generation of a control signal USB-CTRL according to the transient signal detected, that is the transient voltage drop, of 14 mV on average, according to the preferred embodiment of the invention, application of the nominal voltage of 5 volts to the voltage power line V_BUS, according to the control signal USB-CTRL generated at the output of the detection circuit DET 8.

The detection circuit DET 8, in the electronic device STB 10, is adapted to the detection of a connection of a peripheral device to the USB communication interface of the electronic device STB 10, the communication interface comprising the voltage power line V_BUS for the supply of the peripheral device, a range of nominal operating voltage values being associated with this power line, the detection circuit DET 8 is associated with a voltage generator circuit for the application, by the electronic device STB10, via its power supply module PSU 1, of a nominal voltage comprised in a range of nominal operating voltage values. The module DET 8 further constitutes a detection circuit, in the presence of a residual voltage less than a threshold value of the nominal voltage value, such as for example 150 mV, of a transient voltage drop (still called transient signal) resulting from the connection of a peripheral device to the USB communication interface of the electronic device STB 10. The module DET 8 comprises a generation circuit of the control signal USB-CTRL 15 according to the transient voltage drop detected.

FIG. 3 shows the detection of a peripheral device connected to the connector C3 5 of the USB interface of the receiver-decoder STB 10.

At time t1, the peripheral device is connected to the connector C3 5 whereas the power line supplies a residual voltage in the order of 150 mV only, well below the nominal power supply voltage value of the USB bus, equal to 5 volts. A transient voltage drop, considered as a transient signal, then appears on the power line. This voltage drop is amplified and formatted by the detection circuit DET 8. This results in the activation of the signal USB-CTRL 15 calibrated for a period greater than or equal to 10 ms according to the preferred embodiment of the invention, that is up to time t2. This signal USB-CTRL 15 is then sent to the power supply module PSU 1 which activates the lines PL1 11 and PL2 12 from time t3. The power line V_BUS of the USB bus USB-BUS 16 depends on the state of the power line PL2 12, by means of the power interface circuit USBPI 3.

At time t4, a second peripheral device is connected whereas the power line V_BUS is powered at its nominal value in the order of 5 volts. It is to be noted that, in this case, the signal USB-CTRL is not activated at the output of the detection circuit DET 8, owing to the module NOR 830.

FIG. 4 is a diagram representative of the main steps of the method. The step S0 corresponds to the stand-by mode configuration of the receiver decoder equipment STB 10. The stand-by mode is entered following a command from the user, for example. Following the detection of an input command in the stand-by mode, the module KDB 4, linked to the remote control receiver, controls the power supply module PSU 1 to configure the set of equipment STB in stand-by mode and lower its electric consumption. The signal PCTR 14 is set for this purpose and the power supply module PSU 1 ceases to supply nominal voltages on the power lines PL1 11 and PL2 12, thus deactivating certain circuits of the motherboard MB 9, which corresponds to the stand-by mode configuration.

In this configuration, a residual voltage consequently subsists, from the step S1, on the line PL2 12. According to a preferred embodiment of the invention, this residual voltage is in the order of 150 mV and is generated by a circuit comprising a reservoir capacitor. According to a variant, a voltage generator circuit is specifically provided for this purpose inside the power supply module PSU 1.

This voltage is applied at the input of the power interface USBPI 3 of the USB communication interface and is also found on the power line V_BUS of the USB bus USB-BUS 16.

The line V_BUS is further connected to the connector USB C3 5 of the item of equipment STB 10.

At the step S2, when a peripheral device is connected to the connector USB C3 5, a "glitch" is detected by the detection circuit DET 8, which has the effect of activating the signal USB-CTRL 15 at the output of the detection circuit, at the step S3. The signal USB-CTRL 15 is coupled to the control signal of the power supply module PCTRL 14 and can thus control the module PSU 1 for its configuration in a normal power supply mode, that is the normal operating mode, outside of the stand-by mode, where all the functions of the motherboard MB 9 are available. The method for coupling the control signals USB-CTRL 15 and PCTRL 14 is not detailed here, not being necessary to the understanding of the invention.

At the step S4, the module PSU 1 is configured in nominal mode and a nominal voltage is available on the power lines PL1 11 and PL2 12. In this case, and according to the embodiment of the invention, the nominal value of the voltage V_BUS of the bus USB-BUS 16 is comprised in a range of voltage values between 4.5 and 5.5 volts, and is typically equal to 5 volts. This voltage is available on the connector C3 5 of the USB communication interface and can power a connected peripheral device. The control unit also being powered, it enables the logical control of the USB communication interface. The use of the communication interface is then possible, until a new stand-by mode configuration in step S0.

It is to be noted that the normal mode configuration of the item of equipment STB 10, which corresponds to the step S4, can be done by exiting the stand-by mode following the connection of a peripheral device on the interface USB constituted by modules 2, 3, 5 and 8, but can also be done by any other configuration means to the normal mode. The other configuration means in (to the) normal mode are, for example, the action of a user to exit stand-by mode (by pressing a button of a keypad or a remote control), a programmed wake-up of the equipment or even the initialization after powering up.

The invention is not limited to the embodiment described above but also applies to any circuit enabling the detection of a voltage fluctuation induced on the power line of a communication interface by the connection of a peripheral device; the connection taking place when the interface is configured in a stand-by or low consumption mode and when the power line of the interface consequently only supplies a residual voltage much less than its nominal value (for example less than 20% of the nominal value of the power supply voltage in normal mode).

According to a variant of the embodiment, the interface can be powered by a voltage line adapted to carry several values of nominal voltage, corresponding respectively to several operating modes of the interface. In this case, the residual voltage described is defined with reference to one of the nominal voltage values, and preferentially to the smallest of these values.

According to a variant of the embodiment, the transient signal detected is not a variation or fluctuation of the residual voltage. According to this variant, the residual voltage is applied in the form of a periodic wave calibrated at a pre-defined frequency. The connection of a peripheral device can thus be detected by a variation of the frequency of the periodic wave; the variation being thus detected by an adapted detection circuit.

According to other variants of the embodiment, the transient signal detected corresponds to a current variation.

The embodiment detailed above describes the invention in an item of type television receiver-decoder equipment. However, the invention does not apply solely to this type of equipment but to any equipment comprising a communication interface with a power line designed to power an exterior peripheral device connected an interface, such as, for example a FireWire interface (IEEE1394), an HDMI interface (High Definition Multimedia Interface), a PoE interface (Power on Ethernet) or even a communication interface in a vehicle enabling the interconnection of on-board equipment.

The invention also applies, for example, to an office computer, a portable computer, a tablet, a television set, a hi-fi system, an access gateway to a broadband communication network, a car radio, a radio for domestic use, a transceiver device, a personal music player, a projector of audiovisual contents, a still camera, a camcorder, a camera, a item of metrology equipment, an item of medical diagnostic or medical supervision equipment.

The invention claimed is:

1. A method for detecting a connection of a peripheral device to a communication interface of an electronic device, said communication interface comprising a voltage power line for the power supply of said peripheral device, a nominal operating voltage value being associated with said power line, said method comprising:
  applying by said electronic device, a nominal operating voltage at said power line,
  withdrawing by said electronic device, said nominal operating voltage applied to said power line,
  detecting on said power line, in the presence of a residual voltage lower than said nominal operating voltage value, a transient signal resulting from said connection of said peripheral device to said communication interface;
  applying said nominal operating voltage to said voltage power line when said transient signal is detected.

2. The method according to claim 1, wherein said communication interface is compatible with a Universal Serial Bus standard.

3. The method according to claim 1, wherein said residual voltage is less than or equal to 10% of said nominal operating voltage value.

4. The method according to claim 1, wherein said transient signal is a voltage drop of said residual voltage.

5. The method according to claim 1, wherein said electronic device is configurable in a stand-by mode and wherein said residual voltage is applied when said electronic device is configured in said stand-by mode.

6. The method according to claim 1, wherein said residual voltage is less than 500 mV.

7. A circuit for supplying power and detecting, in an electronic device, a connection of a peripheral device to a communication interface of said electronic device, said communication interface comprising a voltage power line for the power supply of said peripheral device, a nominal operating voltage value being associated with said power line, said circuit for supplying power and detecting comprising:
  a voltage generator circuit for the application, by said electronic device, of a nominal operating voltage to said power line,
  a detection circuit for the detection, in the presence of a residual voltage lower than said nominal operating voltage value, of a transient signal from said connection of said peripheral device to said communication interface.

8. The circuit for supplying power and detecting according to claim 7, wherein said transient signal is a voltage drop of said residual voltage.

9. The circuit for supplying power and detecting according to claim 7, wherein said voltage power line is connected to a connector compatible with a Universal Serial Bus standard.

10. The circuit for supplying power and detecting according to claim 7, wherein said electronic device is configurable in a stand-by mode and wherein said voltage generator circuit is configurable for applying said residual voltage when said electronic device is configured in said stand-by mode.

11. The circuit for supplying power and detecting according to claim 7, wherein said residual voltage value is less than or equal to 10% of said nominal operating voltage value.

12. The circuit for supplying power and detecting according to claim 7, wherein said circuit for supplying power and detecting comprises an inhibition circuit configured for detecting said transient signal.

13. The circuit for supplying power and detecting according to claim 7, wherein said residual voltage is less than 500 mV.

14. An electronic device comprising a circuit for supplying power and detecting a connection of a peripheral device to a communication interface of said electronic device, said communication interface comprising a voltage power line for the power supply of said peripheral device, a nominal operating voltage value being associated with said power line, said circuit for supplying power and detecting comprising:
  a voltage generator circuit for the application, by said electronic device, of a nominal operating voltage to said power line,
  a detection circuit for the detection, in the presence of a residual voltage lower than said nominal operating voltage value, of a transient signal from said connection of said peripheral device to said communication interface.

15. The electronic device according to claim 14, wherein said electronic device is configurable in a stand-by mode and wherein said voltage generator circuit is configurable for applying said residual voltage when said electronic device is configured in said stand-by mode.

16. The electronic device according to claim 14, wherein said circuit for supplying power and detecting comprises an inhibition circuit configured for detecting said transient signal.

17. The electronic device according to claim 14, wherein said residual voltage value is less than or equal to 10% of said nominal operating voltage value.

18. The electronic device according to claim 14, wherein said transient signal is a voltage drop of said residual voltage.

19. The electronic device according to claim 14, wherein said voltage power line is connected to a connector compatible with a Universal Serial Bus standard.

20. The electronic device according to claim 14, wherein said residual voltage is less than 500 mV.

21. The electronic device according to claim 14, wherein said electronic device comprises a dedicated power-supply circuit adapted to generate said residual voltage.

22. A method for detecting a connection of a peripheral device to a communication interface of an electronic device, said communication interface comprising a voltage power line for the power supply of said peripheral device, said electronic device being configurable in a nominal mode where a nominal operating voltage is applied to said power line, said method comprising:
  in the presence of a residual voltage on said power line, said residual voltage value being less than said nominal operating voltage value, when a glitch results on said power line from said connection of said peripheral device to said communication interface, configuring said electronic device in said nominal mode.

23. The method according to claim 22, wherein said communication interface is compatible with a Universal Serial Bus standard.

24. The method according to claim 22, wherein said residual voltage value is less than or equal to 10% of said nominal operating voltage value.

25. The method according to claim 22, wherein said residual voltage is less than 500 mV.

26. The method according to claim 22, wherein said electronic device is configurable in a stand-by mode and wherein said residual voltage is applied when said electronic device is configured in said stand-by mode.

\* \* \* \* \*